(12) United States Patent
Oh et al.

(10) Patent No.: US 10,818,569 B2
(45) Date of Patent: Oct. 27, 2020

(54) SEMICONDUCTOR DEVICE AND A METHOD OF MANUFACTURING A SEMICONDUCTOR DEVICE

(71) Applicant: Amkor Technology Singapore Holding Pte. Ltd., Singapore (SG)

(72) Inventors: Se Man Oh, Seoul (KR); Kyoung Yeon Lee, Incheon (KR); Sang Hyeon Lee, Incheon (KR); Min Cheol Shin, Gyeonggi-do (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 0 days.

(21) Appl. No.: 16/209,585

(22) Filed: Dec. 4, 2018

(65) Prior Publication Data

US 2020/0176345 A1    Jun. 4, 2020

(51) Int. Cl.
| | |
|---|---|
| *H01L 23/31* | (2006.01) |
| *H01L 23/48* | (2006.01) |
| *H01L 25/065* | (2006.01) |
| *H01L 21/56* | (2006.01) |
| *H01L 23/42* | (2006.01) |
| *H01L 23/00* | (2006.01) |

(52) U.S. Cl.
CPC ........ *H01L 23/3128* (2013.01); *H01L 21/565* (2013.01); *H01L 23/3114* (2013.01); *H01L 23/42* (2013.01); *H01L 23/481* (2013.01); *H01L 24/17* (2013.01); *H01L 25/0655* (2013.01)

(58) Field of Classification Search
CPC .................. H01L 21/563; H01L 23/36; H01L 2924/15331; H01L 24/16; H01L 21/565; H01L 23/42; H01L 23/3114; H01L 25/0655; H01L 23/3128; H01L 23/481; H01L 24/17
See application file for complete search history.

(56) References Cited

U.S. PATENT DOCUMENTS 7,615,862 B2 * 11/2009 Huang ................ H01L 21/4871
257/706
8,564,114 B1 * 10/2013 Lanzone ............. H01L 23/3128
257/276

OTHER PUBLICATIONS

Amkor Data Sheet—Flip Chip SCP Packages (fsCSP) revised Oct. 2013.

* cited by examiner

*Primary Examiner* — Jasmine J Clark
(74) *Attorney, Agent, or Firm* — Spectrum IP Law Group LLC

(57) ABSTRACT

In one example, a semiconductor package comprises a substrate having a top surface and a bottom surface, an electronic device mounted on the top surface of the substrate and coupled to one or more interconnects on the bottom surface of the substrate, a cover over the electronic device, a casing around a periphery of the cover, and an encapsulant between the cover and the casing and the substrate.

20 Claims, 10 Drawing Sheets

SEMICONDUCTOR DEVICE AND A METHOD OF MANUFACTURING A SEMICONDUCTOR DEVICE

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

Figure 1:
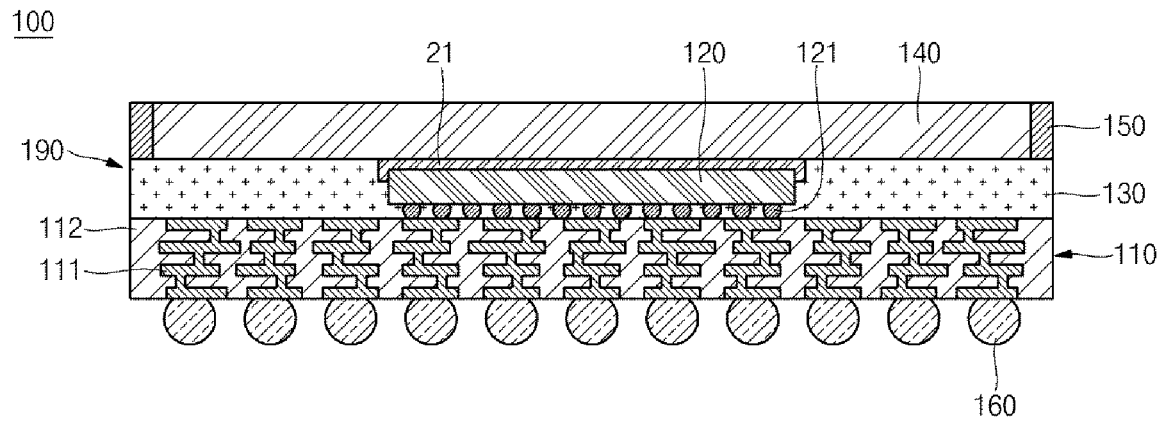
FIG. 1 shows a cross-sectional view of an example semiconductor device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements. It should be noted, however, that the scope of the disclosure and/or the claimed subject matter is not limited in this respect.

The terms "and/or" include any single item, or any combination of the items, in the list joined by "and/or". As used in this disclosure, the singular forms are intended to include the plural forms as well, unless the context clearly indicates otherwise. It should be noted, however, that the scope of the disclosure and/or the claimed subject matter is not limited in this respect.

The terms "comprises," "comprising," "includes," and/or "including," are "open ended" terms and specify the presence of stated features, but do not preclude the presence or addition of one or more other features. It should be noted, however, that the scope of the disclosure and/or the claimed subject matter is not limited in this respect.

The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure. It should be noted, that the scope of the disclosure and/or the claimed subject matter is not limited in this respect.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements. It should be noted, however, that the scope of the disclosure and/or the claimed subject matter is not limited in this respect.

The terms "top" and "bottom" generally refer to opposite sides or surfaces of a device, feature, or structure corresponding to the orientation of the device, feature, or structure as shown in one or more of the drawing figures. In general, a top side or surface may refer to a first side surface and a bottom side or surface, and a bottom side or surface may refer to a second side or surface that is located opposite to the first surface. It should be noted, however, that the scope of the disclosure and/or the claimed subject matter is not limited in this respect.

The term "coplanar" may refer to two objects, sides of objects, surfaces of objects, and/or other features that lie in the same plane or generally in the same plane at least in part. In geometric terms, a set of points are coplanar if there is a geometric plane containing all the points. In general, two objects or structures may be referred to as "coplanar" when a surface, an end, a side, or a feature of each of the two objects or structures lies in a single plane at least in part. Furthermore, the term "planar" may refer to a surface that is planar or nearly planar within an acceptable tolerance. It should be noted, however, that the scope of the disclosure and/or the claimed subject matter is not limited in this respect.

The term "substantial" may refer to a portion that is greater than or equal to half, and/or may further refer to other portions, for example sixty-percent or greater, seventy-percent or greater, eighty-percent or greater, or ninety-percent or greater. In some embodiments, substantial may also refer to 100% or greater, for example if a first structure is greater in size and/or volume than a second structure, the first structure may be over the second structure and may be considered as covering a substantial portion of the second structure by the nature of the first structure covering more area and/or volume than the second structure and/or wherein the first structure at least partially exceeds beyond an edge or boundary of the second structure. Furthermore, in some embodiments, substantial also may refer to a portion that is less than 50%, for example where the portion is ample or sufficient in quality and/or quantity. In yet other embodiments, substantial may mean all or nearly all. It should be noted, however, that the scope of the disclosure and/or the claimed subject matter is not limited in this respect.

DESCRIPTION

The present description includes, among other features, examples of a semiconductor package such as a flip-chip chip scale package (fcCSP) and example methods to form a flip-chip chip scale package. In a first example, a semiconductor package comprises a substrate having a top surface and a bottom surface, an electronic device mounted on the top surface of the substrate and coupled to one or more interconnects on the bottom surface of the substrate, a cover over the electronic device, and a casing around a periphery of the cover. An encapsulant can be between the cover and the substrate, and/or between the casing and the substrate.

In a second example, a method to form a semiconductor package comprises disposing two or more semiconductor die on a top surface of a substrate, forming an encapsulant between the semiconductor die on the top surface of the substrate, attaching an array of covers over the two or more semiconductor die wherein a cover of the array of covers can be over one of the semiconductor die, wherein the array of covers includes a casing around a periphery of each of the covers, and attaching two or more interconnects to a bottom surface of the substrate to electrically couple the semiconductor die to the interconnects via the substrate to form a subassembly of the two or more semiconductor die. The subassembly of the two or more semiconductor die can be singulated into individual semiconductor packages by a saw operation that cuts the encapsulant between the die, wherein each of the individual semiconductor packages comprises a cover over a semiconductor die and a substantial portion of the substrate, and one or more surfaces of the encapsulant can be coplanar with one or surfaces of the substrate and one or more surfaces of the casing.

In a third example, a method to form a semiconductor package comprises coupling two or more semiconductor die to a substrate strip, disposing the block array over the two or more semiconductor die, wherein a cover of the bock array is over one of the semiconductor die, and forming an encapsulant between a first semiconductor die and a second semiconductor die of the two or more semiconductor die. The substrate strip can be singulated into two or more semiconductor packages, wherein one cover can be over a semiconductor die and a substantial portion of the substrate, and wherein one or more surfaces of the encapsulant is coplanar with one or more surfaces of the substrate and one or more surfaces of the casing.

Other examples are included in the present disclosure. Such examples may be found in the figures, in the claims, and/or in the description of the present disclosure.

FIG. 1 shows a cross-sectional view of an example semiconductor device 100. In the example shown in FIG. 1, semiconductor device 100 can comprise a substrate 110, an electronic device 120, an encapsulant 130, a cover 140, a casing 150 and interconnects 160.

Substrate 110 can comprise conductive structure 111 with one or more conductive layers and dielectric structure 112 with one or more dielectric layers. Electronic device 120 can comprise interconnects 121.

Substrate 110, encapsulant 130, cover 140, casing 150, and interconnects 160 can be referred to as a semiconductor package 190 and package 190 can provide protection for electronic device 120 from external elements and/or environmental exposure. In addition, semiconductor package 190 can provide electrical coupling between external electrical components (not shown) and interconnects 160. As shown in FIG. 1 in addition to various other figures below, in one or more embodiments cover 140 is over a substantial portion of substrate 110. The term "substantial" may refer to a portion that is greater than or equal to half, and/or may further refer to other portions, for example sixty-percent or greater, seventy-percent or greater, eighty-percent or greater, or ninety-percent or greater. In some embodiments, substantial may also refer to 100% or greater, for example if a first structure is greater in size and/or volume than a second structure, the first structure may be over the second structure and may be considered as covering a substantial portion of the second structure by the nature of the first structure covering more area and/or volume than the second structure and/or wherein the first structure at least partially exceeds beyond an edge or boundary of the second structure. Furthermore, in some embodiments, substantial also may refer to a portion that is less than 50%, for example where the portion is ample or sufficient in quality and/or quantity. In yet other embodiments, substantial may mean all or nearly all. It should be noted, however, that the scope of the disclosure and/or the claimed subject matter is not limited in this respect.

Figure 2A:
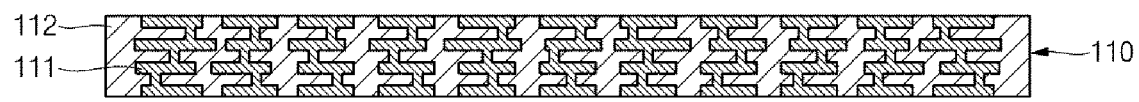
FIGS. 2A to 2L show cross-sectional views of an example method for manufacturing an example semiconductor device.

FIGS. 2A to 2L show cross-sectional views of an example method for manufacturing semiconductor device 100. FIG. 2A shows a cross-sectional view of semiconductor device 100 at an early stage of manufacture.

In the example shown in FIG. 2A, substrate 110 can comprise one or more conductive layers of conductive structure 111 and one or more dielectric layers of conductive structure 112. Substrate 110 can comprise, for example, a printed circuit board (e.g., a prebuilt laminate circuit structure having a core), or a leadframe. In other examples, substrate 110 can comprise a high-density fan-out structure (HDFO) or buildup redistribution structure such as, for example, a SLIM (Silicon-Less Integrated Module) or SWIFT (Silicon Wafer Integrated Fan-out Technology) structure. In some examples, substrate 110 can comprise a dielectric layer of dielectric structure 112 for electrically isolating neighboring conductive layers of conductive structure 111 from each other. Substrate 110 can be formed to have a build-up structure in which respective layers of conductive structure 111 and of dielectric structure 112 are sequentially and/or repeatedly formed.

Conductive structure 111 can be exposed to the outside through top and bottom surfaces of substrate 110. Electronic device 120 can be electrically connected to a conductive layer of conductive structure 111 exposed to a top surface of substrate 110, and interconnects 160 can be electrically connected to a conductive layer of conductive structure 111 exposed to the bottom surface of substrate 110.

In some examples, conductive structure 111 can be referred to as, or can comprise, a metal layer, a metal wiring layer, or a circuit pattern. Conductive structure 111 can comprise an electrically conductive material such as, for example, gold (Au), silver (Ag), copper (Cu), aluminum (Al), or palladium (Pd). Examples for forming conductive layer 111 include using an electroplating process or a physical vapor deposition (PVD) process. The thickness of one or more layers of conductive structure 111 can range from about 10 microns to about 20 microns. Conductive layer 111 can provide an electrically conductive path between electronic device 120 and interconnects 160.

In some examples, dielectric structure 112 can be referred to as an insulator, or a passivation layer. Dielectric structure 112 can comprise an electrically insulating material such as, for example, oxide, nitride, polyimide, benzo cyclo butene, poly benzoxazole, bismaleimidetriazine (BT), phenolic resin, or epoxy. Examples for forming dielectric layer 112 can comprise thermal oxidation, chemical vapor deposition (CVD), physical vapor deposition (PVD), atomic layer deposition (ALD), low pressure chemical vapor deposition (LPCVD), plasma enhanced chemical vapor deposition (PECVD), sheet lamination, or evaporating. The thickness of dielectric structure 112 can range from about 25 microns to about 100 microns. In some examples, dielectric structure 112 can protect conductive structure 111 from environmental exposure and dielectric structure 112 can provide electrical isolation between conductive elements in substrate 110.

Figure 2B:
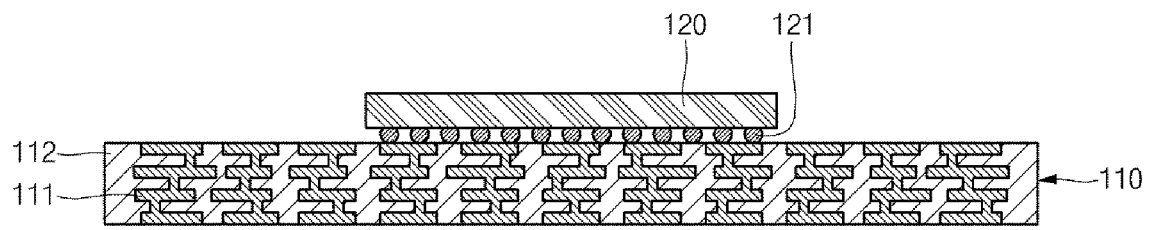

FIG. 2B shows a cross-sectional view of semiconductor device 100 at a later stage of manufacture. In the example shown in FIG. 2B, electronic device 120 can be attached to a top portion of substrate 110. In some examples, electronic device 120 can comprise a semiconductor die. In some examples, semiconductor die 120 can comprise a semiconductor material such as, for example, silicon (Si). Semiconductor die 120 can comprise passive electronic circuit elements (not shown) or active electronic circuit elements (not shown) such as transistors. Semiconductor die 120 can comprise interconnects 121. In some examples, interconnects 121 can be referred to as conductive bumps, conductive balls, such as solder balls, conductive pillars, such as copper pillars, or conductive posts, such as copper posts. The thickness of interconnects 121 can range from about 40 microns to about 100 microns.

In addition, although only one semiconductor die 120 is shown in FIG. 2B, this is not a limitation of the present disclosure. In other examples, more than one semiconductor die 120 can be attached to the top portion of substrate 110. In some examples, semiconductor die 120 can comprise, an electrical circuit, such as a digital signal processor (DSP), a microprocessor, a network processor, a power management processor, an audio processor, a radio frequency (RF) circuit, a wireless baseband system-on-chip (SoC) processor, a sensor or an application specific integrated circuit. Semiconductor die 120 can be attached to the top portion of substrate 110 by electrically connecting conductive bumps 121 to conductive structure 111 exposed at the top surface of substrate 110. In some examples, semiconductor die 120 can be electrically connected to conductive structure 111 by a mass reflow process, a thermal compression process or a laser bonding process.

Figure 2C:
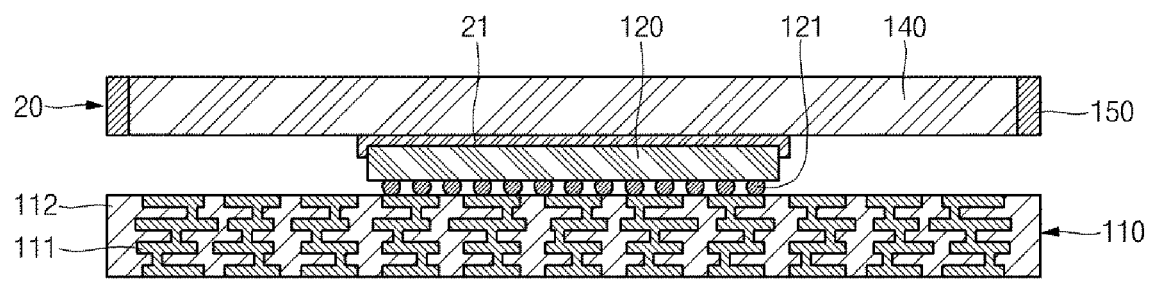

FIG. 2C shows a cross-sectional view of semiconductor device 100 at a later stage of manufacture. In the example shown in FIG. 2C, array 20 and corresponding cover 140 can be attached to the top portion of semiconductor die 120 using an adhesion material 21. Adhesion material 21 can thus serve as interface between cover 140 and the top of semiconductor die 120, and as seen in the present example, can also cover at least a portion of the sidewall of semiconductor die 120. In some examples, the adhesion material 21 can comprise a thermal interface material (TIM). TIM 21 can be formed between semiconductor die 120 and array 20. TIM 21 can include a high thermal conductivity filler (e.g., aluminum nitride (AlN), boron nitride (BN), alumina (Al2O3), silicon carbide (SiC), etc.), a binder or adhesive (e.g., a polymer resin) and/or additives. TIM 21 can have a thermal conductivity in the range from approximately 5 w/m·k to approximately 100 w/m·k. TIM 21 can be formed or applied by a variety of methods, including spraying, dipping, injection, or silk screen coating. The thickness of TIM 21 can range from about 30 microns to about 50 microns. In some examples, TIM 21 can transfer the heat generated from semiconductor die 120 to array 20. In some embodiments as shown in FIG. 2C and in various other figures, TIM 21 can extend to one or more ends of semiconductor die 120, and on other embodiments may extend beyond and/or over one or more ends, edges, or corners of semiconductor die 120, and the scope of the disclosure and/or the claims is not limited in this respect. In some examples, array 20 can comprise cover 140 and casing 150.

In some examples, cover 140 can be referred to as a heat radiation member. In some embodiments, cover 140 can comprise a generally planar heat radiation member. It should be noted that the term "planar" may refer to a surface that is planar or nearly planar within an acceptable tolerance. It should be noted, however, that the scope of the disclosure and/or the claimed subject matter is not limited in this respect.

In some examples, casing 150 can be referred to as a resin portion. In one or more embodiments as will be discussed in further detail below, casing 150 may be disposed around the periphery of cover 140. In some embodiments, cover 140 may have four sides, and casing 150 may cover all four sides of cover 140 in a contiguous manner, or may nearly cover all four sides of cover 140 in a contiguous or non-contiguous manner, for example wherein casing 150 may have one or more of a notch, slot, or groove, or other structure, that may prevent casing 150 from completely covering all four sides of cover 140 and/or an entire periphery of cover 140, and the scope of the disclose and/or the claimed subject matter is not limited in this respect. Before describing the attaching of array 20, a process of forming array 20 will first be described.

Figure 2D:
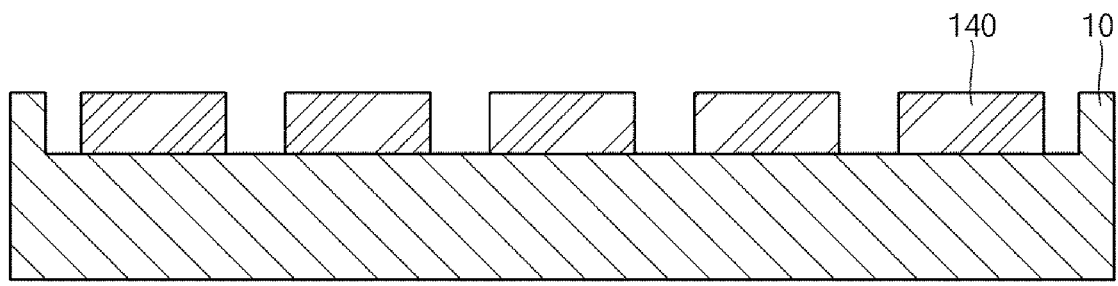
Figure 2E:
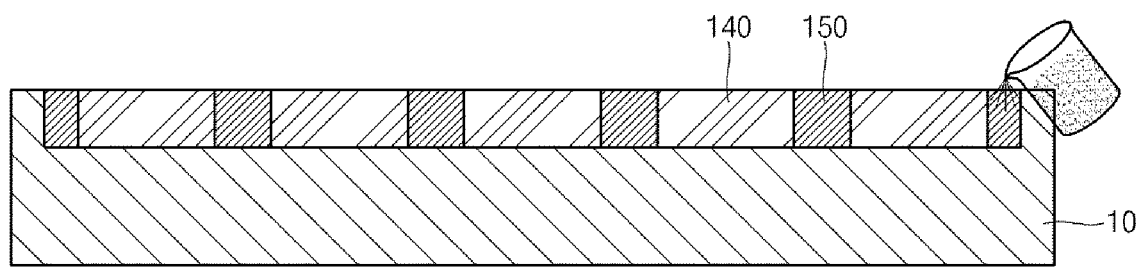
Figure 2F:
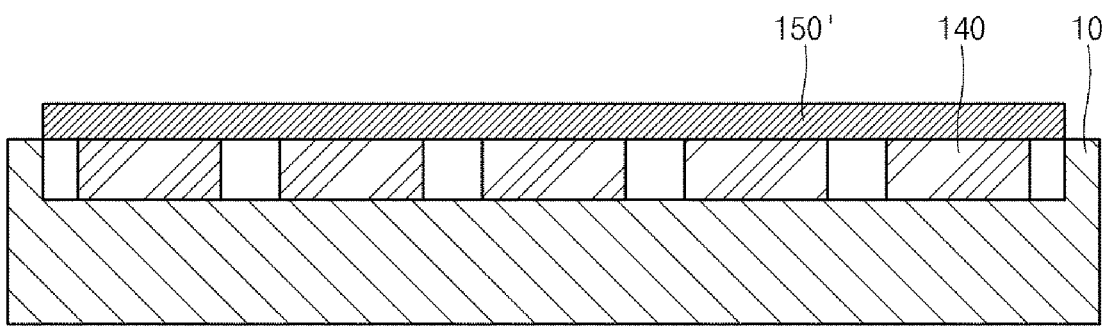
Figure 2G:
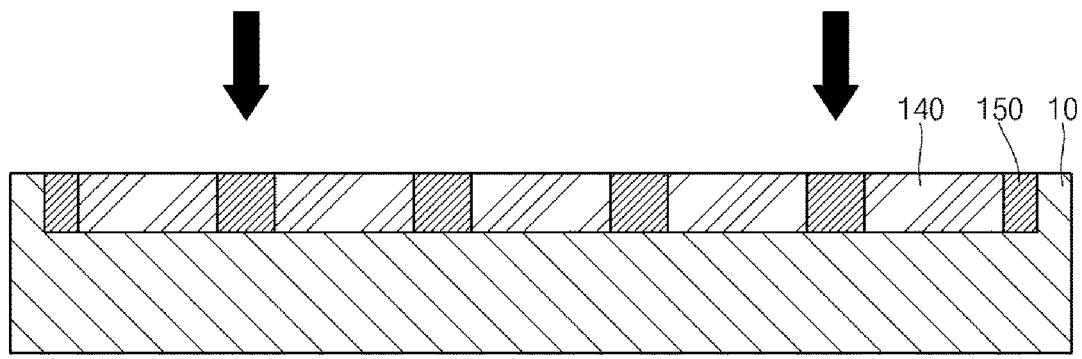
Figure 2H:
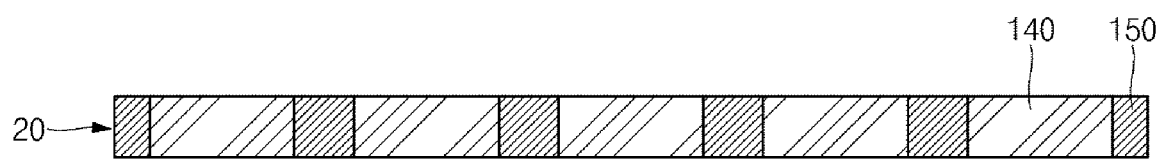

In the example shown in FIG. 2D, a plurality of covers 140 can be arranged on a mold or carrier 10, leaving a groove or spacing between the covers 140 at a constant interval. In some examples, cover 140 can be attached to mold or carrier 10 using an adhesion material (not shown). In some examples, cover 140 can comprise a thermally conductive metal having good thermal conductivity, for example, copper (Cu), aluminum (Al), gold (Au), or silver (Ag). In some embodiments, cover 140 can comprise a generally planar thermally conductive metal. It should be noted that the term "planar" may refer to a surface that is planar or nearly planar within an acceptable tolerance. It should be noted, however, that the scope of the disclosure and/or the claimed subject matter is not limited in this respect. The thickness of cover 140 can range from about 200 microns to about 400 microns. Next, in the example shown in FIG. 2E, gel-type resin can be poured into regions between each of the plurality of covers 140 and can be cured by an annealing process, thereby forming casing 150. In other example shown in FIG. 2F, a resin sheet 150' can be positioned on the plurality of covers 140. Resin sheet 150' can be in a semi-curable state. Next, in the example shown in FIG. 2G, resin sheet 150' can be positioned between each of the plurality of covers 140 by pressure and cured by an annealing process, thereby forming casing 150. In some examples, casing 150 can comprise an epoxy, a phenolic resin, a glass epoxy, polymer, polyimide, polyester, silicone or ceramic. The thickness of casing 150 can range from about 200 microns to about 400 microns. Therefore, casing 150 connects covers 140 to one another. Then, in the example shown in FIG. 2H, the plurality of covers 140 and casing 150 are separated from mold or carrier 10, thereby completing array 20.

Figure 2I:
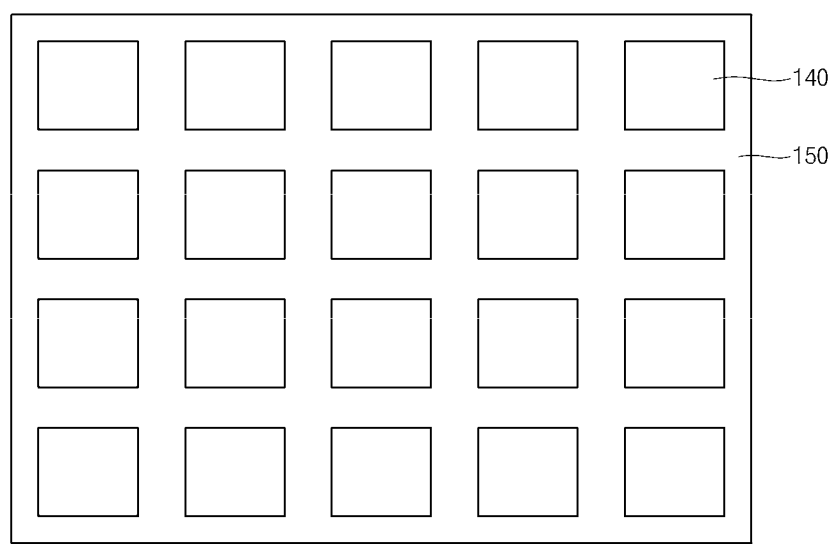

Array 20, in the example shown in FIG. 2I, the plurality of covers 140 can be arranged to be spaced apart at a constant interval from each other and casing 150 can be formed between each of the plurality of covers 140, so that array 20 can be configured in the form of a plate. Since array 20 allows individual steps of arranging the respective covers 140 on semiconductor die 120 to be skipped, the productivity can be improved. In some examples, in a state in which a plurality of semiconductor die 120 are attached to the top portion of substrate 110, the respective covers 140 can be attached to the plurality of semiconductor die 120 through attachment of single array 20, thereby improving the productivity. A plurality of arrays 20 can be attached according to the size of substrate 110 and the number of semiconductor die 120. In some embodiments, one or more covers 140 may have four sides, and casing 150 may cover all four sides of a cover 140 in a contiguous manner, or may nearly cover all four sides of a cover 140 in a contiguous or non-contiguous manner, for example wherein casing 150 may have one or more of a notch, slot, or groove, or other structure that may prevent casing 150 from completely covering all four sides of cover 140 and/or an entire periphery of cover 140, and the scope of the disclosure and/or the claimed subject matter is not limited in this respect.

Returning to FIG. 2C, some portion of cover 140 in array 20 can be coupled to the top surface of semiconductor die 120. In some examples, an area of cover 140 can be larger than the area of semiconductor die 120 and smaller than the area of substrate 110. In some examples, cover 140 can be formed to cover semiconductor die 120 and a portion of substrate 110 can be exposed to the outside of cover 140. Therefore, it is unnecessary to form adhesion material 21 on the entire bottom surface of array 20. Rather, adhesion material 21 can be formed on only a portion of cover 140 corresponding to semiconductor die 120, thereby saving the cost associated with the formation of adhesion material 21. In addition, since cover 140 has a larger area than semiconductor die 120, the heat generated from semiconductor die 120 can be rapidly radiated to the outside. In some examples, casing 150 can be formed to surround side surfaces of cover 140. Therefore, a top surface of cover 140 can be exposed to the outside and rapidly radiates the heat generated from semiconductor die 120 to the outside.

Figure 2J:
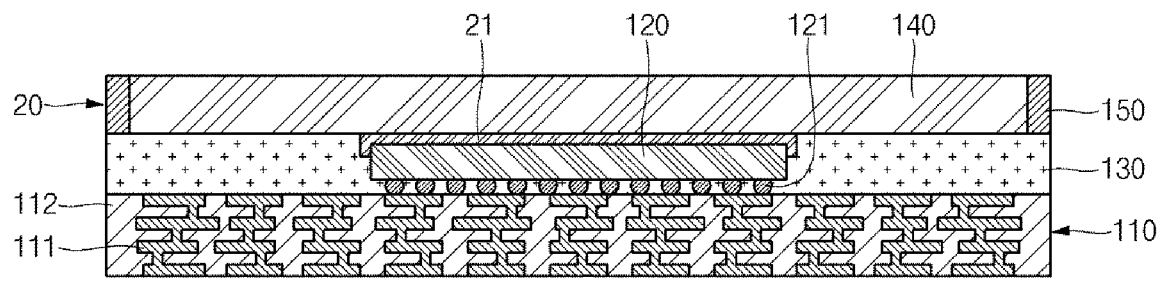

Moving now to FIG. 2J, a cross-sectional view of semiconductor device 100 is shown at a later stage of manufacture. In the example shown in FIG. 2J, encapsulant 130 can be formed between substrate 110 and array 20. Encapsulant 130 encapsulates semiconductor die 120 and a top portion of substrate 110. In some examples, encapsulant 130 can contact side and bottom surfaces of semiconductor die 120 and not contact the top surface of semiconductor die 120. In some examples, encapsulant 130 can comprise any one of various encapsulating or molding materials, for example, a resin, a polymer compound, a polymer having a filler, an epoxy resin, an epoxy resin having a filler, epoxy acrylate having a filler, a silicone material, combinations thereof or and equivalents thereof. In some examples, encapsulant 130 can be formed by one of various methods, for example, a compression molding process, a liquid phase encapsulant molding process, a vacuum lamination process, a paste printing process, or a film assisted molding process. The thickness of encapsulant 130 can range from about 120 microns to about 200 microns. In some examples, encapsulant 130 can be injected into a region between substrate 110 and array 20 and cured, thereby encapsulating semiconductor die 120.

Figure 2K:
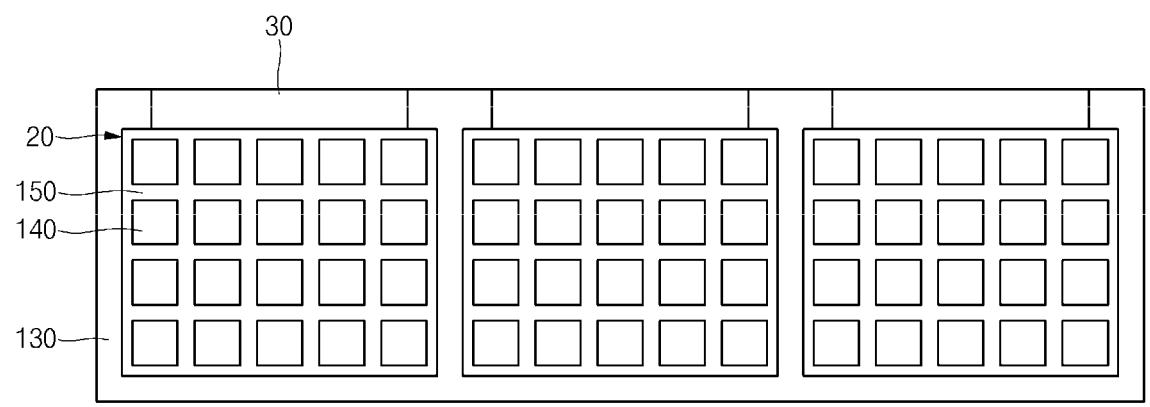

In some examples, as shown in FIG. 2K, substrate 110, semiconductor die 120 and array 20 can be placed in a mold and encapsulant 130 can be injected into the mold through a molding inlet 30, thereby encapsulating semiconductor die 120. In some examples, encapsulant 130 can protect semiconductor die 120 from external environments. There can be examples where casing 150 can comprise similar materials and/or can be formed by a process similar to one or more of those described with respect to encapsulant 130.

Figure 2L:
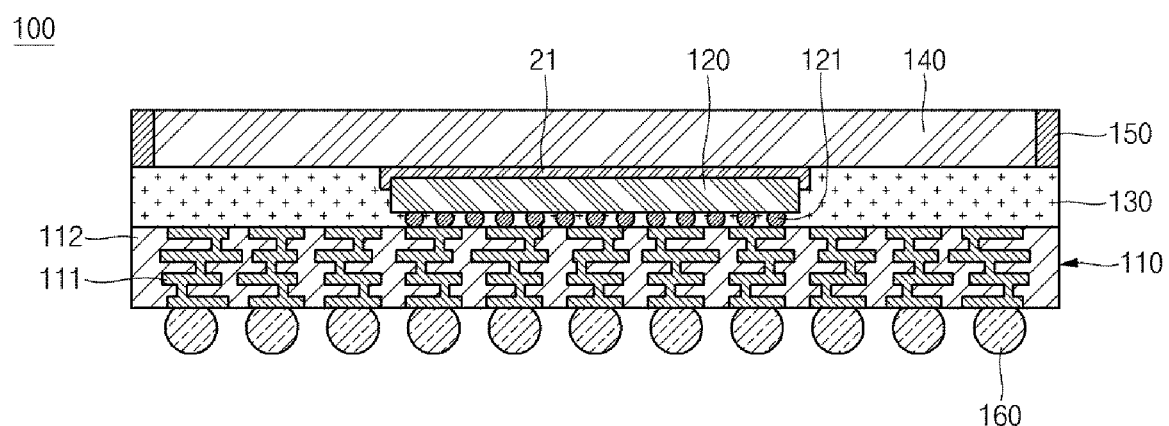

FIG. 2L shows a cross-sectional view of semiconductor device 100 at a later stage of manufacture. In the example shown in FIG. 2L, substrate 110, array 20 and encapsulant 130 can be subjected to a singulation operation to separate each of the plurality of semiconductor die 120 and each of the plurality of covers 140. In some examples, substrate 110, casing 150 and encapsulant 130 can be separated by means of a sawing tool. In some examples, before singulating substrate 110, array 20 and encapsulant 130, interconnects 160 can be attached to conductive structure 111 exposed at the bottom surface of substrate 110. In other examples, interconnects 160 can be attached to conductive structure 111 exposed at the bottom surface of substrate 110 after the sawing. For example, interconnects 160 can be formed as a ball grid array, a land grid array, or a pin grid array. In addition, interconnects 160 can comprise tin (Sn), silver (Ag), lead (Pb), copper (Cu), Sn—Pb, $Sn_{37}$—Pb, $Sn_{95}$—Pb, Sn—Pb—Ag, Sn—Cu, Sn—Ag, Sn—Au, Sn—Bi, or Sn—Ag—Cu. Examples for forming interconnects 160 include using a ball drop process, a screen-printing process, or an electroplating process. The thickness of interconnects 160 can range from about 150 microns to about 300 microns. Interconnects 160 can serve as electrical contacts for providing electrical signals between substrate 110 and external electrical components (not shown).

The completed semiconductor device 100 can comprise substrate 110, semiconductor die 120 mounted on substrate 110, encapsulant 130 encapsulating semiconductor die 120, cover 140 attached to the top portion of semiconductor die 120, casing 150 surrounding side surfaces of cover 140, and interconnects 160 attached to the bottom surface of substrate 110.

FIGS. 3A to 3D show cross-sectional views of another example method for manufacturing semiconductor device 100. In the example shown in FIG. 3A, electronic device 120 can be attached to a top portion of substrate 110. In some examples, electronic device 120 can comprise a semiconductor die. In some examples, semiconductor die 120 can comprise a semiconductor material such as, for example, silicon (Si). Semiconductor die 120 can comprise passive electronic circuit elements (not shown) or active electronic circuit elements (not shown) such as transistors. Semiconductor die 120 can comprise interconnects 121. In some examples, interconnects 121 can be referred to as conductive bumps, conductive balls, such as solder balls, conductive pillars, such as copper pillars, or conductive posts, such as copper posts.

Figure 3A:
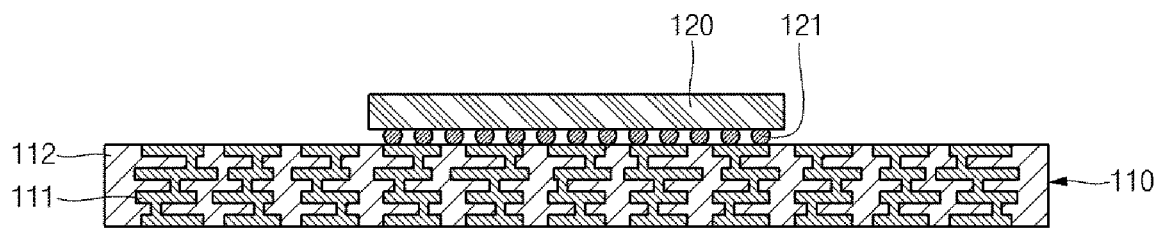
FIGS. 3A to 3D show cross-sectional views of another example method for manufacturing a semiconductor device.

In addition, although only one semiconductor die 120 is shown in FIG. 3A, this is not a limitation of the present disclosure. In other examples, more than one semiconductor die 120 can be attached to the top portion of substrate 110. Semiconductor die 120 can be attached to the top portion of substrate 110 by electrically connecting conductive bumps 121 to conductive structure 111 exposed at the top surface of substrate 110. In some examples, semiconductor die 120 can be electrically connected to conductive structure 111 by a mass reflow process, a thermal compression process or a laser bonding process.

Figure 3B:
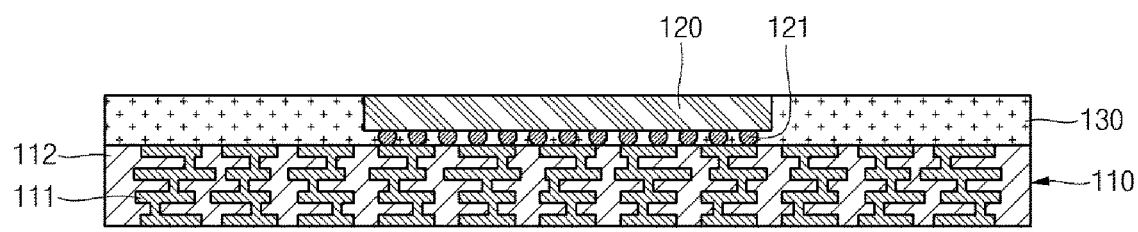

FIG. 3B shows a cross-sectional view of semiconductor device 100 at a later stage of manufacture. In the example shown in FIG. 3B, encapsulant 130 can be formed at the side surfaces of semiconductor die 120. Encapsulant 130 encapsulates semiconductor die 120 and the top portion of substrate 110. In addition, encapsulant 130 can expose the top surface of semiconductor die 120 to the outside. In some examples, encapsulant 130 can contact side and bottom surfaces of semiconductor die 120 and not contact the top surface of semiconductor die 120. In some examples, encapsulant 130 can comprise any one of various encapsulating or molding materials, for example, a resin, a polymer compound, a polymer having a filler, an epoxy resin, an epoxy resin having a filler, epoxy acrylate having a filler, a silicon resin, combinations thereof or and equivalents thereof. In some examples, encapsulant 130 can be formed by one of various methods, for example, a compression molding process, a liquid phase encapsulant molding process, a vacuum lamination process, a paste printing process, or a film assisted molding process.

Figure 3C:
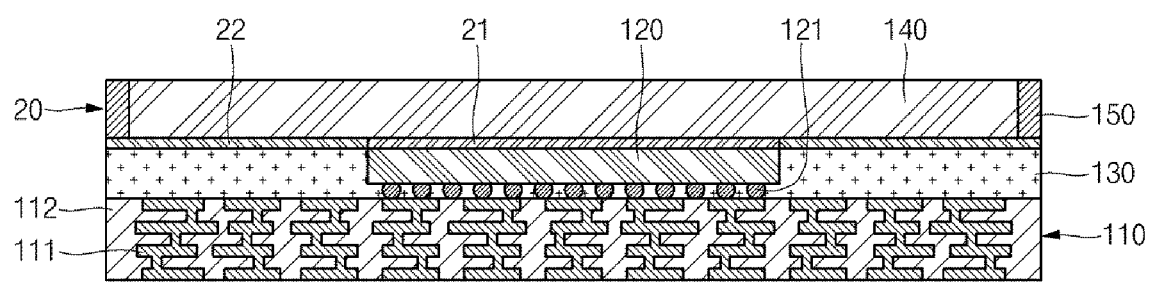

FIG. 3C shows a cross-sectional view of semiconductor device 100 at a later stage of manufacture. In the example shown in FIG. 3C, array 20 and corresponding cover 140 can be attached to the top portion of semiconductor die 120 and encapsulant 130 using an adhesion material 21, 22. Adhesion material 21,22 can thus serve as interface between cover 140 and the top of semiconductor die 120. In some examples, adhesion material 21, 22 can comprise a thermal interface material (TIM) 21 and an adhesive 22. The adhesion material, whether TIM 21 and/or adhesive 22, can in some examples also extend to cover at least a portion of the sidewall of semiconductor die 120. TIM 21 can be formed between semiconductor die 120 and array 20. TIM 21 can include a high thermal conductivity filler (e.g., aluminum nitride (AlN), boron nitride (BN), alumina (Al2O3), silicon carbide (SiC), etc.), a binder or adhesive (e.g., a polymer resin) and/or additives. TIM 21 can have a thermal conductivity in the range from approximately 5 w/m·k to approximately 100 w/m·k. TIM 21 can be formed or applied by a variety of methods, including spraying, dipping, injection, or silk screen coating. The thickness of TIM 21 can range from about 30 microns to about 50 microns. In some examples, TIM 21 can transfer the heat generated from semiconductor die 120 to array 20. Adhesive 22 can be formed between encapsulant 130 and array 20. The thickness of adhesive 22 can range from about 30 microns to about 50 microns. Adhesive 22 can contact encapsulant 130 and array 20. In addition, the thermal conductivity of TIM 21 can be greater than the thermal conductivity of adhesive 22. There can be examples where TIM 21 and adhesive 22 can comprise a same and/or continuous material. In some examples, array 20 can comprise cover 140 and casing 150. In some examples, cover 140 can be referred to as a heat radiation member. In some examples, casing 150 can be referred to as a resin portion. Process for forming array 20 is shown in FIGS. 2D to 2I.

In the example shown in FIG. 3C, some portion of cover 140 in array 20 can be coupled to the top surface of semiconductor die 120. In some examples, an area of cover 140 can be larger than that of semiconductor die 120 and smaller than substrate 110. In addition, since cover 140 has a larger area than semiconductor die 120, the heat generated from semiconductor die 120 can be rapidly radiated to the outside. In some examples, casing 150 can be formed to surround side surfaces of cover 140. Therefore, a top surface of cover 140 can be exposed to the outside and rapidly radiates the heat generated from semiconductor die 120 to the outside.

Figure 3D:
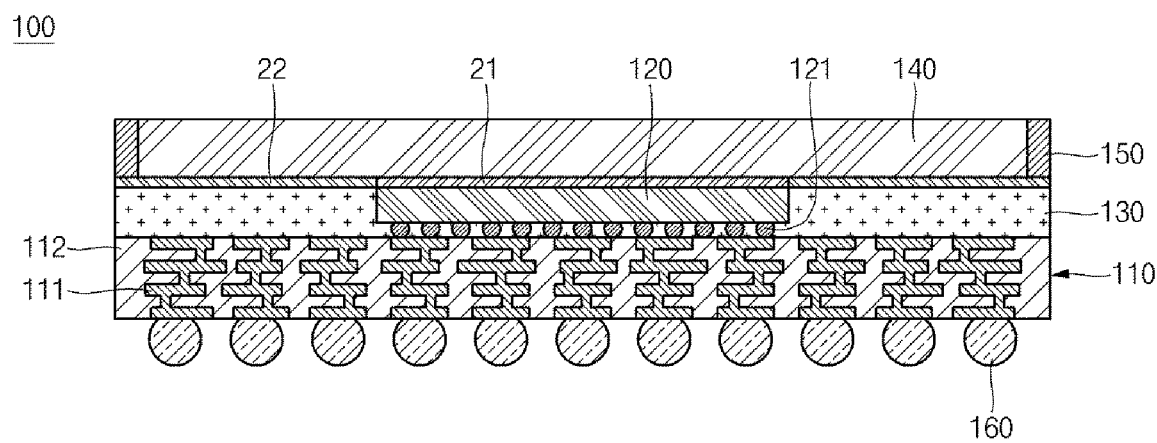

FIG. 3D shows a cross-sectional view of semiconductor device 100 at a later stage of manufacture. In the example shown in FIG. 3D, substrate 110, array 20 and encapsulant 130 can be subjected to a sawing operation to separate each of the plurality of semiconductor die 120 and each of the plurality of covers 140. In some examples, substrate 110, casing 150 and encapsulant 130 can be separated by means of a sawing tool. In some examples, before sawing substrate 110, array 20 and encapsulant 130, interconnects 160 can be attached to conductive structure 111 exposed at the bottom surface of substrate 110. In other examples, interconnects 160 can be attached to conductive structure 111 exposed at the bottom surface of substrate 110 after the sawing. For example, interconnects 160 can be formed as a ball grid array, a land grid array, or a pin grid array. In addition, interconnects 160 can comprise tin (Sn), silver (Ag), lead (Pb), copper (Cu), Sn—Pb, $Sn_{37}$—Pb, $Sn_{95}$—Pb, Sn—Pb—Ag, Sn—Cu, Sn—Ag, Sn—Au, Sn—Bi, or Sn—Ag—Cu. Examples for forming interconnects 160 include using a ball drop process, a screen-printing process, or an electroplating process.

The completed semiconductor device 100 can comprise substrate 110, semiconductor die 120 mounted on substrate 110, encapsulant 130 encapsulating semiconductor die 120, cover 140 attached to the top portion of semiconductor die 120, casing 150 surrounding side surfaces of cover 140, and interconnects 160 attached to the bottom surface of substrate 110.

Figure 4:
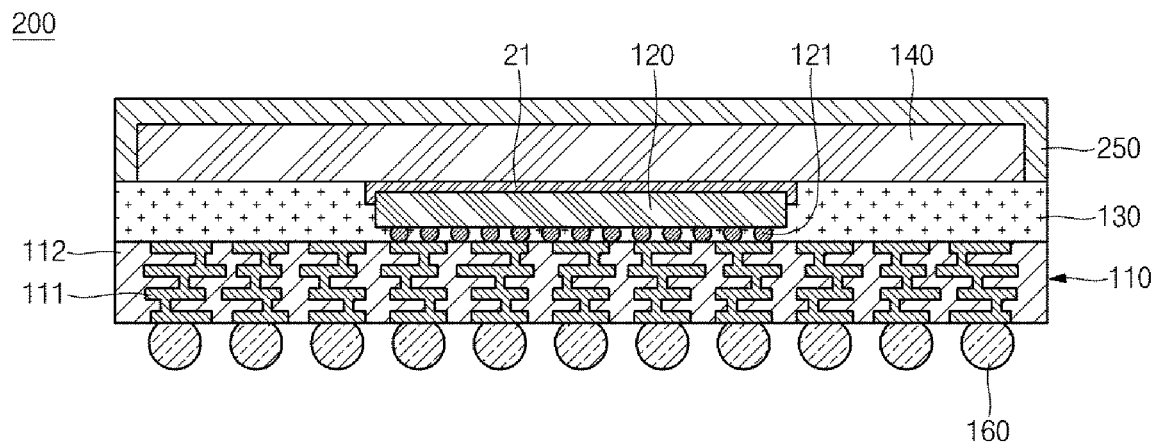
FIG. 4 shows a cross-sectional view of another example of a semiconductor device.

FIG. 4 shows a cross-sectional view of another example of a semiconductor device 200. Semiconductor device 200 can be similar to semiconductor device 100. Semiconductor device 200 can comprise casing 250 formed on the top surface of cover 140. Casing 250 can protect to the top surface of cover 140.

Figure 5A:
FIGS. 5A to 5L show cross-sectional views of another example method for manufacturing a semiconductor device.

FIGS. 5A to 5L show cross-sectional views of another example method for manufacturing semiconductor device 200. FIG. 5A shows a cross-sectional view of semiconductor device 200 at an early stage of manufacture.

In the example shown in FIG. 5A, substrate 110 can comprise one or more conductive layers of conductive structure 111 and one or more dielectric layers of dielectric structure 112. Substrate 110 can comprise, for example, a printed circuit board (e.g., a prebuilt laminate circuit structure having a core), or a leadframe. In other examples, substrate 110 can comprise a high-density fan-out structure (HDFO) or buildup redistribution structure such as, for example, a SLIM (Silicon-Less Integrated Module) or SWIFT (Silicon Wafer Integrated Fan-out Technology) structure. In some examples, substrate 110 can comprise a dielectric layer of dielectric structure 112 for electrically isolating neighboring conductive layers of conductive structure 111 from each other. Substrate 110 can be formed to have a build-up structure in which respective layers of conductive structure 111 and dielectric structure 112 are repeatedly or sequentially formed.

Conductive structure 111 can be exposed to the outside through top and bottom surfaces of substrate 110. Electronic device 120 can be electrically connected to a conductive layer of conductive structure 111 exposed to a top surface of substrate 110, and interconnects 160 can be electrically connected to a conductive layer of conductive structure 111 exposed to the bottom surface of the substrate 110.

In some examples, conductive structure 111 can be referred to as, or can comprise, a metal layer, a metal wiring layer, or a circuit pattern. Conductive structure 111 can comprise an electrically conductive material such as, for example, gold (Au), silver (Ag), copper (Cu), aluminum (Al), or palladium (Pd). Example for forming conductive structure 111 includes using an electroplating process or a physical vapor deposition (PVD) process. Conductive structure 111 can connect to substrate 110 and electronic device 120. In addition, conductive structure 111 can connect to substrate 110 and interconnects 160.

In some examples, dielectric structure 112 can be referred to as an insulator, or a passivation layer. Dielectric structure 112 can comprise an electrically insulating material such as, for example, oxide, nitride, polyimide, benzo cyclo butene, poly benz oxazole, bismaleimidetriazine (BT), phenolic resin, or epoxy. Examples for forming dielectric structure 112 can comprise thermal oxidation, chemical vapor deposition (CVD), physical vapor deposition (PVD), atomic layer deposition (ALD), low pressure chemical vapor deposition (LPCVD), plasma enhanced chemical vapor deposition (PECVD), sheet lamination, or evaporating. In some examples, dielectric structure 112 can protect conductive structure 111 from environmental exposure and dielectric structure 112 can provide electrical isolation between conductive elements in substrate 110.

Figure 5B:
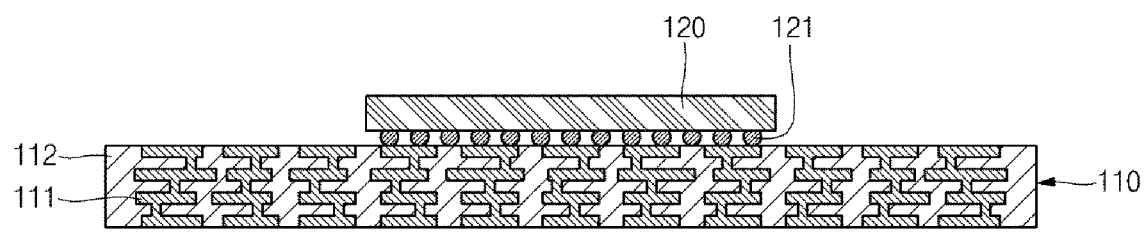

FIG. 5B shows a cross-sectional view of semiconductor device 200 at a later stage of manufacture. In the example shown in FIG. 5B, electronic device 120 can be attached to a top portion of substrate 110. In some examples, electronic device 120 can comprise a semiconductor die. In some examples, semiconductor die 120 can comprise a semiconductor material such as, for example, silicon (Si). Semiconductor die 120 can comprise passive electronic circuit elements (not shown) or active electronic circuit elements (not shown) such as transistors. Semiconductor die 120 can comprise interconnects 121. In some examples, interconnects 121 can be referred to as conductive bumps, conductive balls, such as solder balls, conductive pillars, such as copper pillars, or conductive posts, such as copper posts.

In addition, although only one semiconductor die 120 is shown in FIG. 5B, this is not a limitation of the present disclosure. In other examples, more than one semiconductor die 120 can be attached to the top portion of substrate 110. In some examples, semiconductor die 120 can comprise, an electrical circuit, such as a digital signal processor (DSP), a microprocessor, a network processor, a power management processor, an audio processor, a radio frequency (RF) circuit, a wireless baseband system-on-chip (SoC) processor, a sensor or an application specific integrated circuit. Semiconductor die 120 can be attached to the top portion of substrate 110 by electrically connecting conductive bumps 121 to conductive structure 111 exposed to the top surface of substrate 110. In some examples, semiconductor die 120 can be electrically connected to conductive structure 111 by a mass reflow process, a thermal compression process or a laser bonding process.

Figure 5C:
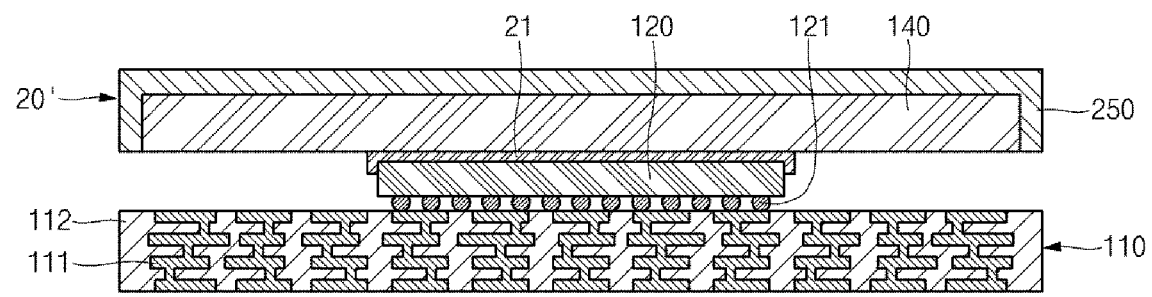

FIG. 5C shows a cross-sectional view of semiconductor device 200 at a later stage of manufacture. In the example shown in FIG. 5C, array 20' can be attached to the top portion of semiconductor die 120 using an adhesion material 21.

In some examples, adhesion material 21 can comprise a thermal interface material (TIM). TIM 21 can be formed between semiconductor die 120 and array 20'. TIM 21 can include a high thermal conductivity filler (e.g., aluminum nitride (AlN), boron nitride (BN), alumina (Al2O3), silicon carbide (SiC), etc.), a binder or adhesive (e.g., a polymer resin) and/or additives. TIM 21 can have a thermal conductivity in the range from approximately 5 w/m·k to approximately 100 w/m·k. TIM 21 can be formed or applied by a variety of methods, including spraying, dipping, injection, or silk screen coating. The thickness of TIM 21 can range from about 30 microns to about 50 microns. In some examples, TIM 21 can transfer the heat generated from semiconductor die 120 to array 20'. In some examples, array 20' can comprise cover 140 and casing 250. In some examples, cover 140 can be referred to as a heat radiation member. In some examples, casing 250 can be referred to as a resin portion. Before describing the attaching of array 20', a process of forming array 20' will first be described.

Figure 5D:
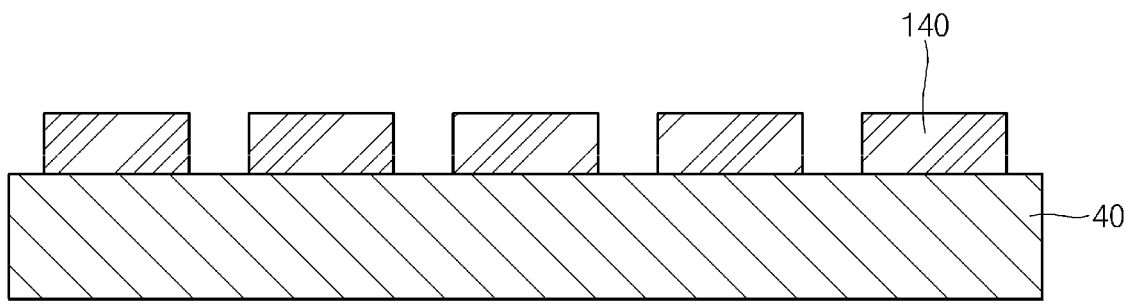
Figure 5E:
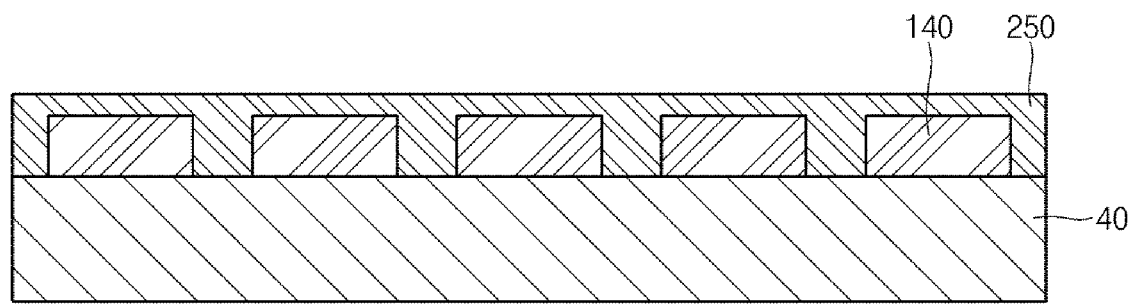
Figure 5F:
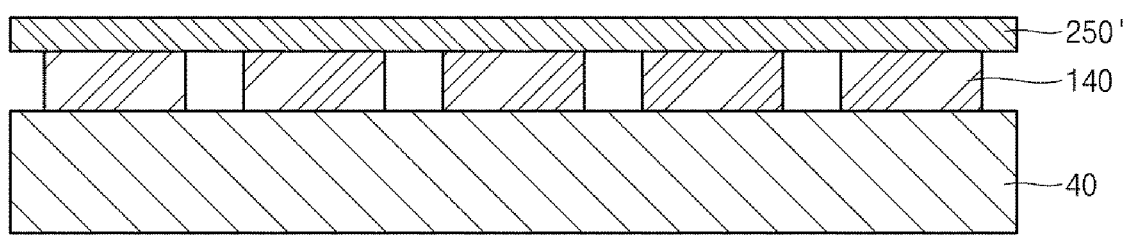
Figure 5G:
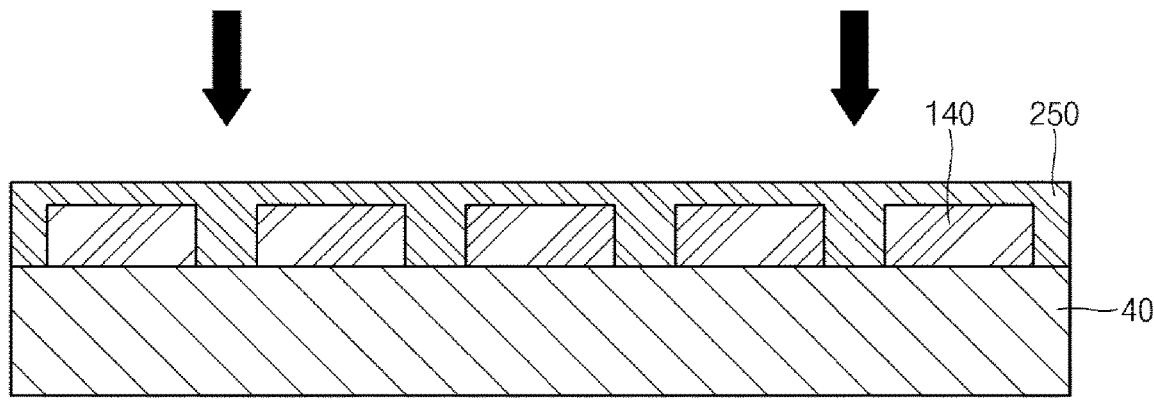
Figure 5H:
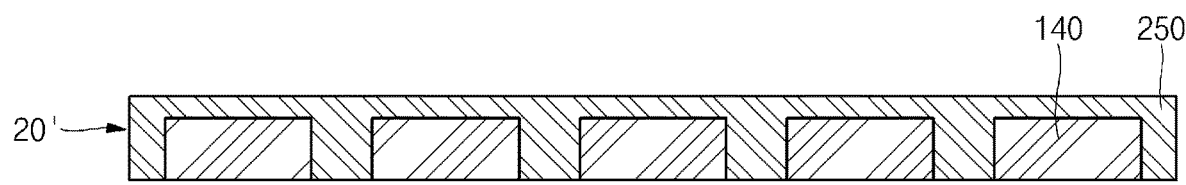

In the example shown in FIG. 5D, a plurality of covers 140 can be arranged on a carrier 40 at a constant interval. In some examples, cover 140 can be attached to carrier 40 using an adhesion material (not shown). In some examples, carrier 40 can comprise a metal, silicon (Si) or glass. In some examples, cover 140 can comprise a thermally conductive metal having good thermal conductivity, for example, copper (Cu), aluminum (Al), gold (Au), or silver (Ag). The thickness of cover 140 can range from about 200 microns to about 400 microns. Next, in the example shown in FIG. 5E, casing 250 can be formed by placing carrier 40 having covers 140 arranged on a mold (not shown) and injecting an epoxy molding compound (EMC) into the mold. In other example shown in FIG. 5F, a resin sheet 250' can be positioned on the plurality of covers 140. Resin sheet 250' can be semi-curable state. Next, in the example shown in FIG. 5G, resin sheet 250' can be positioned between each of the plurality of covers 140 by pressure and cured by an annealing process, thereby forming casing 250. In some examples, casing 250 can comprise an epoxy, a phenolic resin, a glass epoxy, polymer, polyimide, polyester, silicon or ceramic. The thickness of casing 250 can range from about 300 microns to about 500 microns. Therefore, casing 250 connects covers 140 to one another. Then, in the example shown in FIG. 5H, carrier 40 can be eliminated, thereby completing array 20' including the plurality of covers 140 and casing 250. Since the side and top surfaces of covers 140 of array 20' can be covered by casing 250, an unnecessary electrical contact between array 20' and an external circuit can be prevented.

Figure 5I:
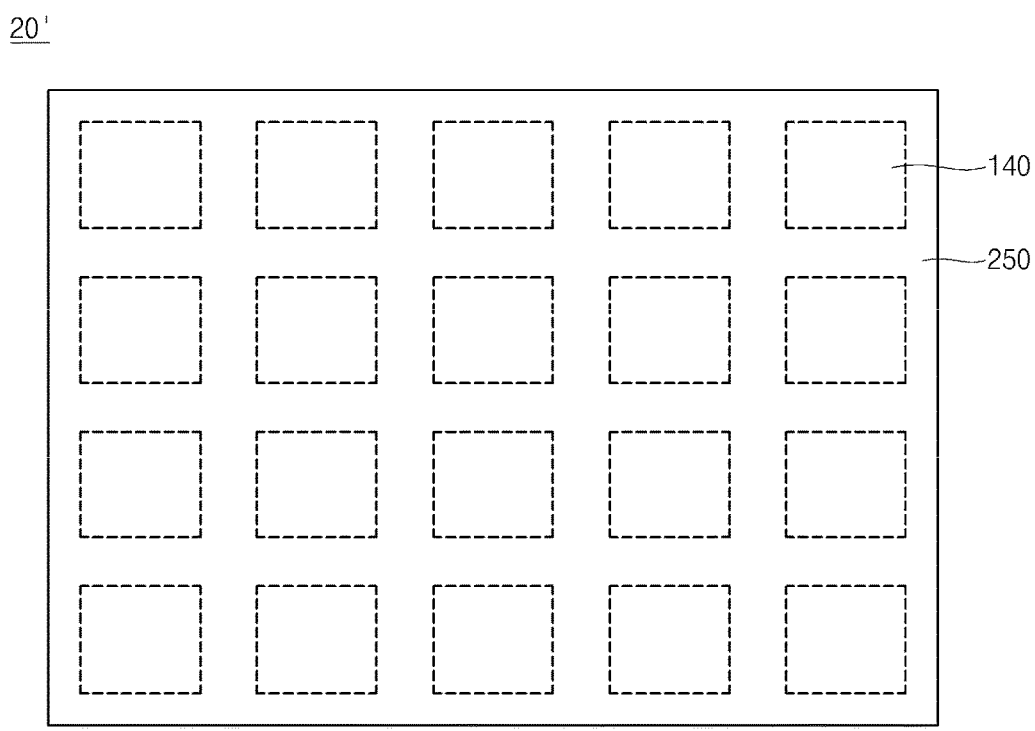

Array 20', in the example shown in FIG. 5I, the plurality of covers 140 can be arranged to be spaced apart at a constant interval from each other and casing 250 can be formed between each of the plurality of covers 140, so that array 20' can be configured in the form of a plate. Since array 20' allows individual steps of arranging the respective covers 140 on semiconductor die 120 to be skipped, the productivity can be improved. In some examples, in a state in which a plurality of semiconductor die 120 are attached to the top portion of substrate 110, the respective covers 140 can be attached to the plurality of semiconductor die 120 through attachment of single array 20', thereby improving the productivity. A plurality of arrays 20' can be attached according to the size of substrate 110 and the number of semiconductor die 120.

In the example shown in FIG. 5C, some portion of cover 140 in array 20' can be contacted to the top surface of semiconductor die 120. In some examples, an area of cover 140 can be larger than that of semiconductor die 120 and smaller than substrate 110. In some examples, cover 140 can be formed to cover semiconductor die 120 and a portion of substrate 110 can be exposed to the outside of cover 140. Therefore, it is unnecessary to form adhesion material 21 on the entire bottom surface of array 20'. Rather, adhesion material 21 can be formed on only a portion of cover 140 corresponding to semiconductor die 120, thereby saving the cost associated with the formation of adhesion material 21. In addition, since cover 140 has a larger area than semiconductor die 120, the heat generated from semiconductor die 120 can be rapidly radiated to the outside. In some examples, casing 250 can be formed to surround side and top surfaces of cover 140. Therefore, casing 250 can prevent electrical contact between array 20' and an external circuit.

Figure 5J:
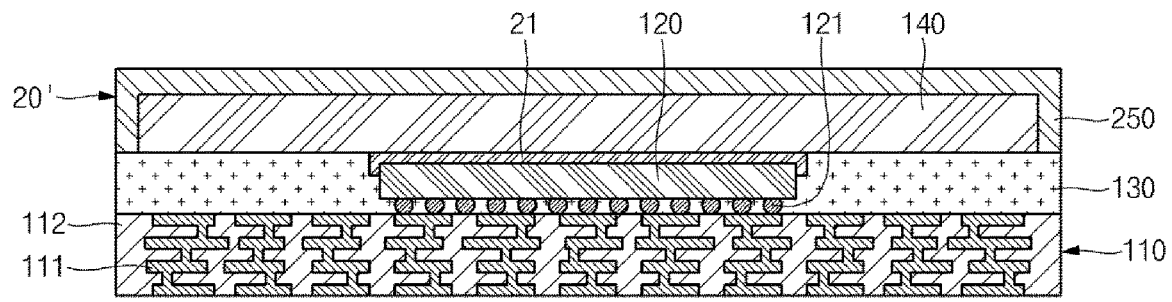

FIG. 5J shows a cross-sectional view of semiconductor device 200 at a later stage of manufacture. In the example shown in FIG. 5J, encapsulant 130 can be formed between substrate 110 and array 20'. Encapsulant 130 encapsulates semiconductor die 120 from a top portion of substrate 110. In some examples, encapsulant 130 can contact side and bottom surfaces of semiconductor die 120 and not contact the top surface of semiconductor die 120. In some examples, encapsulant 130 can comprise any one of various encapsulating or molding materials, for example, a resin, a polymer compound, a polymer having a filler, an epoxy resin, an epoxy resin having a filler, epoxy acrylate having a filler, a silicon resin, combinations thereof or and equivalents thereof. In some examples, encapsulant 130 can be formed by one of various methods, for example, a compression molding process, a liquid phase encapsulant molding process, a vacuum lamination process, a paste printing process, or a film assisted molding process. In some examples, encapsulant 130 can be injected into a region between substrate 110 and array 20' and cured, thereby encapsulating semiconductor die 120.

Figure 5K:
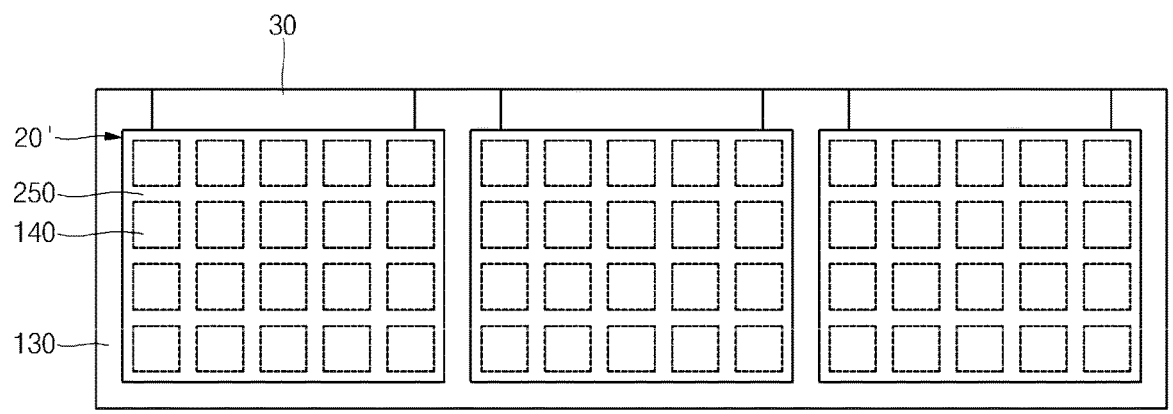

For example, as shown in FIG. 5K substrate 110, semiconductor die 120 and array 20' can be placed in a mold and encapsulant 130 can be injected into the mold through a molding inlet 30, thereby encapsulating semiconductor die 120. In some examples, encapsulant 130 can protect semiconductor die 120 from external environments.

Figure 5L:
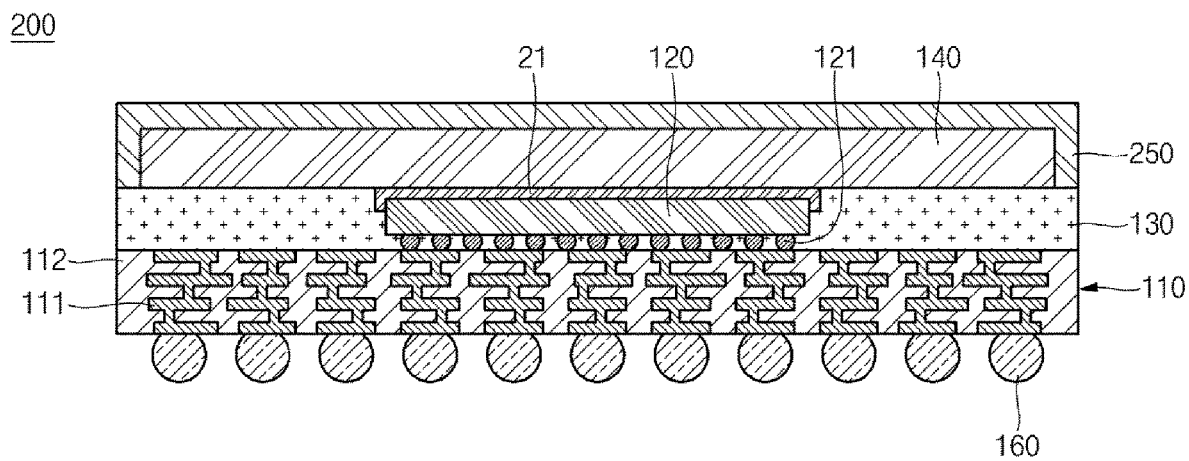

FIG. 5L shows a cross-sectional view of semiconductor device 200 at a later stage of manufacture. In the example shown in FIG. 5L, substrate 110, array 20' and encapsulant 130 can be subjected to a sawing operation to separate each of the plurality of semiconductor die 120 and each of the plurality of covers 140. In some examples, substrate 110, casing 250 and encapsulant 130 can be separated by means of a sawing tool. In some examples, before sawing substrate 110, array 20' and encapsulant 130, interconnects 160 can be attached to conductive structure 111 exposed to the bottom surface of substrate 110. In other examples, interconnects 160 can be attached to conductive structure 111 exposed to the bottom surface of substrate 110 after the sawing. For example, interconnects 160 can be formed as a ball grid array, a land grid array, or a pin grid array. In addition, interconnects 160 can comprise tin (Sn), silver (Ag), lead (Pb), copper (Cu), Sn—Pb, $Sn_{37}$—Pb, $Sn_{95}$—Pb, Sn—Pb—Ag, Sn—Cu, Sn—Ag, Sn—Au, Sn—Bi, or Sn—Ag—Cu. Examples for forming interconnects 160 include using a ball drop process, a screen-printing process, or an electroplating process.

The completed semiconductor device 200 can comprise substrate 110, semiconductor die 120 mounted on substrate 110, encapsulant 130 encapsulating semiconductor die 120, cover 140 attached to the top portion of semiconductor die 120, casing 250 surrounding side and top surfaces of cover 140, and interconnects 160 attached to the bottom surface of substrate 110.

FIGS. 6A to 6D show cross-sectional views of another example method for manufacturing semiconductor device 200. In the example shown in FIG. 6A, electronic device 120 can be attached to a top portion of substrate 110. In some examples, electronic device 120 can comprise a semiconductor die. In some examples, semiconductor die 120 can comprise a semiconductor material such as, for example, silicon (Si). Semiconductor die 120 can comprise passive electronic circuit elements (not shown) or active electronic circuit elements (not shown) such as transistors. Semiconductor die 120 can comprise interconnects 121. In some examples, interconnects 121 can be referred to as conductive bumps, conductive balls, such as solder balls, conductive pillars, such as copper pillars, or conductive posts, such as copper posts.

Figure 6A:
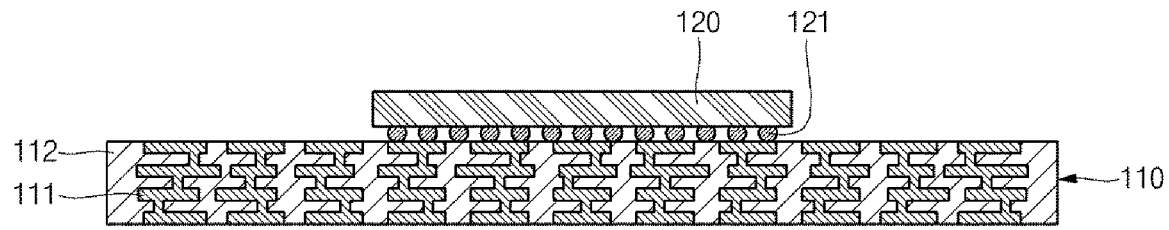
FIGS. 6A to 6D show cross-sectional views of another example method for manufacturing a semiconductor device.

In addition, although only one semiconductor die 120 is shown in FIG. 6A, this is not a limitation of the present disclosure. In other examples, more than one semiconductor die 120 can be attached to the top portion of substrate 110. Semiconductor die 120 can be attached to the top portion of substrate 110 by electrically connecting conductive bumps 121 to conductive structure 111 exposed to the top surface of substrate 110. In some examples, semiconductor die 120 can be electrically connected to conductive structure 111 by a mass reflow process, a thermal compression process or a laser bonding process.

Figure 6B:
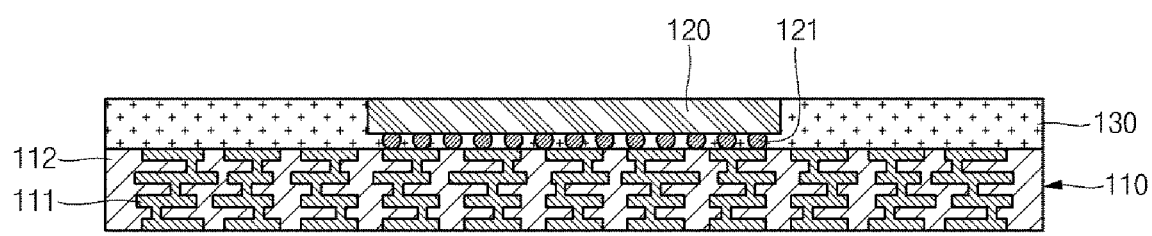

FIG. 6B shows a cross-sectional view of semiconductor device 200 at a later stage of manufacture. In the example shown in FIG. 6B, encapsulant 130 can be formed at the side surfaces of semiconductor die 120. Encapsulant 130 encapsulates semiconductor die 120 from the top portion of substrate 110. In addition, encapsulant 130 can expose the top surface of semiconductor die 120 to the outside. In some examples, encapsulant 130 can contact side and bottom surfaces of semiconductor die 120 and not contact the top surface of semiconductor die 120. In some examples, encapsulant 130 can comprise any one of various encapsulating or molding materials, for example, a resin, a polymer compound, a polymer having a filler, an epoxy resin, an epoxy resin having a filler, epoxy acrylate having a filler, a silicon resin, combinations thereof or and equivalents thereof. In some examples, encapsulant 130 can be formed by one of various methods, for example, a compression molding process, a liquid phase encapsulant molding process, a vacuum lamination process, a paste printing process, or a film assisted molding process.

Figure 6C:
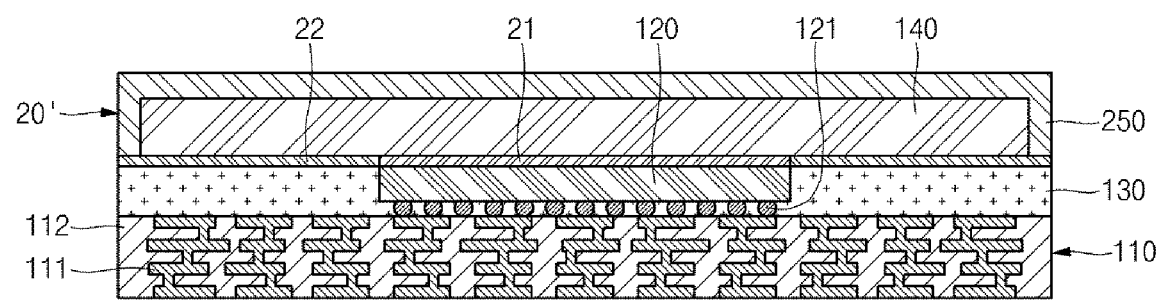

FIG. 6C shows a cross-sectional view of semiconductor device 200 at a later stage of manufacture. In the example shown in FIG. 6C, array 20' can be attached to the top portion of semiconductor die 120 and encapsulant 130 using an adhesion material 21, 22. In some examples, adhesion material 21, 22 can comprise a thermal interface material (TIM) and adhesive 22. TIM 21 can be formed between semiconductor die 120 and array 20'. TIM 21 can include a high thermal conductivity filler (e.g., aluminum nitride (AlN), boron nitride (BN), alumina (Al2O3), silicon carbide (SiC), etc.), a binder or adhesive (e.g., a polymer resin) and/or additives. TIM 21 can have a thermal conductivity in the range from approximately 5 w/m·k to approximately 100 w/m·k. TIM 21 can be formed or applied by a variety of methods, including spraying, dipping, injection, or silk screen coating. The thickness of TIM 21 can range from about 30 microns to about 50 microns. In some examples, TIM 21 can transfer the heat generated from semiconductor die 120 to array 20'. Adhesive 22 can be formed between encapsulant 130 and array 20.

The thickness of adhesive 22 can range from about 30 microns to about 50 microns. Adhesive 22 can contact encapsulant 130 and array 20. In addition, the thermal conductivity of TIM 21 can be greater than the thermal conductivity of adhesive 22. There can be examples where TIM 21 and adhesive 22 can comprise a same and/or continuous material. In some examples, array 20' can comprise cover 140 and casing 150. In some examples, cover 140 can be referred to as a heat radiation member. In some examples, casing 150 can be referred to as a resin portion. Process for forming array 20' is shown in FIGS. 5D to 5G. In the example shown in FIG. 6C, some portion of cover 140 in array 20' can be coupled to the top surface of semiconductor die 120. In some examples, an area of cover 140 can be larger than that of semiconductor die 120 and smaller than substrate 110. In addition, since cover 140 has a larger area than semiconductor die 120, the heat generated from semiconductor die 120 can be rapidly radiated to the outside. In some examples, casing 250 can be formed to surround side and top surfaces of cover 140. Therefore, casing 250 can prevent electrical contact between the array 20' and an external circuit.

Figure 6D:
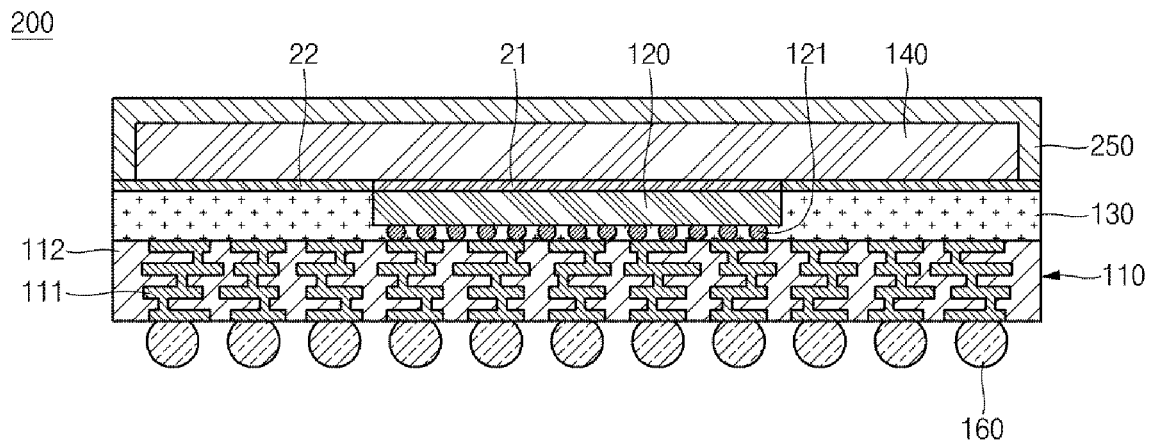

FIG. 6D shows a cross-sectional view of semiconductor device 200 at a later stage of manufacture. In the example shown in FIG. 6D, substrate 110, array 20' and encapsulant 130 can be subjected to a sawing operation to separate each of the plurality of semiconductor die 120 and each of the plurality of covers 140. In some examples, substrate 110, casing 250 and encapsulant 130 can be separated by means of a sawing tool. In some examples, before sawing substrate 110, array 20' and encapsulant 130, interconnects 160 can be attached to conductive structure 111 exposed to the bottom surface of substrate 110. In other examples, interconnects 160 can be attached to conductive structure 111 exposed at the bottom surface of substrate 110 after the sawing. For example, interconnects 160 can be formed as a ball grid array, a land grid array, or a pin grid array. In addition, interconnects 160 can comprise tin (Sn), silver (Ag), lead (Pb), copper (Cu), Sn—Pb, $Sn_{37}$—Pb, $Sn_{95}$—Pb, Sn—Pb—Ag, Sn—Cu, Sn—Ag, Sn—Au, Sn—Bi, or Sn—Ag—Cu. Examples for forming interconnects 160 include using a ball drop process, a screen-printing process, or an electroplating process.

The completed semiconductor device 200 can comprise substrate 110, semiconductor die 120 mounted on substrate 110, encapsulant 130 encapsulating semiconductor die 120, cover 140 attached to the top portion of semiconductor die 120, casing 250 surrounding side and top surfaces of cover 140, and interconnects 160 attached to the bottom surface of substrate 110.

In summary, a semiconductor package such as a flip-chip chip scale package (fcCSP) comprises a substrate having a top surface and a bottom surface, an electronic device mounted on the top surface of the substrate and coupled to one or more interconnects on the bottom surface of the substrate, a cover over the electronic device and a substantial portion of the substrate, a casing around a periphery of the cover, and an encapsulant between the cover and the casing and the substrate, wherein the encapsulant is coplanar with one or more ends of the substrate and the casing.

Methods to form such a semiconductor package include attaching multiple covers or lids to respective electronic devices or semiconductor die of the package by first forming an array of the covers or lids into a block array wherein the block array includes a casing that holds the covers or lids in the block array. The block array may then be attached to a substrate having multiple electronic devices attached to the substrate wherein one cover or lid in the block array covers a respective electronic device. An encapsulant may be molded between the electronic devices and the covers or lids, either before the block array is attached or after the block array is attached.

Individual semiconductor packages may be singulated from the resulting structure, for example by sawing through the encapsulant in between the covers. The singulated semiconductor packages may have a resulting structure wherein the cover or lid covers the electronic device and a substantial portion of the substrate, and the casing covers the remaining portion of the substrate around the periphery of the cover or lid.

In some embodiments, the casing and the cover or lid are coplanar wherein a surface of the cover or lid is exposed to the ambient environment. In other embodiments, the casing completely or substantially covers the cover or lid wherein the cover or lid is not exposed to the ambient environment. The cover or lid may function as a heat radiating device, and may comprise a thermally conductive metal, to dissipate heat from the electronic device. In some embodiments, a thermal interface material may be between the electronic device and the cover or lid.

The above example methods to form a semiconductor package allow multiple covers to be attached to multiple electronic devices at a higher rate than a pick in place or one-by-one method to result in a higher unit per hour manufacturing throughput. Furthermore, the resulting semiconductor packages result in a semiconductor device that has a cover or lid comprising a larger portion of the semiconductor device to enhance thermal dissipation of heat from the electronic devices of the semiconductor packages. Forming the covers in a block array allows for singulation of the individual semiconductor packages using a standard sawing process, allowing for smaller form factors of the individual semiconductor packages.

The present disclosure includes reference to certain examples. It will be understood, however, by those skilled in the art that various changes may be made, and equivalents may be substituted, without departing from the scope of the disclosure. In addition, modifications may be made to the disclosed examples without departing from the scope of the present disclosure. Therefore, it is intended that the present disclosure not be limited to the examples disclosed, but that the disclosure will include all examples falling within the scope of the appended claims.

What is claimed is:

1. A semiconductor package, comprising:
 a substrate having a top surface and a bottom surface;
 an electronic device on the top surface of the substrate and coupled to one or more interconnects on the bottom surface of the substrate;
 a cover over the electronic device, wherein the cover is over a substantial portion of the substrate;
 a casing around a periphery of the cover, wherein the casing comprises a non-metallic material; and
 an encapsulant between the cover and the substrate, and between the casing and the substrate.

2. The semiconductor package of claim 1, wherein the cover is over a majority of the substrate.

3. The semiconductor package of claim 1, wherein the cover has four sides and the casing covers all four sides.

4. The semiconductor package of claim 1, wherein the cover has four sides and the casing nearly covers all four sides.

5. The semiconductor package or claim 1, wherein a surface of the encapsulant is coplanar with a surface of the substrate and one or more surfaces of the casing.

6. The semiconductor package of claim 1, further comprising an adhesion material between the cover and the electronic device.

7. The semiconductor package of claim 1, further comprising a thermal interface material between the cover and the electronic device.

8. he semiconductor package of claim 1, wherein the cover comprises a generally planar heat radiation member.

9. The semiconductor package of claim 1, wherein the cover comprises a thermally conductive metal.

10. The semiconductor package of claim 1, wherein a top surface of the cover is coplanar with a top surface of the casing wherein the top surface of the cover is exposed.

11. The semiconductor package of claim 1, wherein the casing is over the cover wherein the cover is not exposed.

12. A method to form a semiconductor package, the method comprising:

disposing two or more semiconductor die on a top surface of a substrate;

forming an encapsulant between the semiconductor die on the top surface of the substrate;

attaching an array of covers over the two or more semiconductor die, and wherein a cover of the array of covers is over one of the semiconductor die, wherein the array of covers includes a casing around a periphery of two or more covers of the array of covers;

attaching two or more interconnects to a bottom surface of the substrate to electrically couple the semiconductor die to the interconnects via the substrate to form a subassembly of the two or more semiconductor die; and singulating the subassembly into individual semiconductor packages, wherein an individual semiconductor package comprises a piece of substrate, a piece of encapsulant, a piece of casing, and one semiconductor die;

wherein one of the covers is over the one semiconductor die and a substantial portion of the piece of substrate, and one or more surfaces of the piece of encapsulant are coplanar with one or more surfaces of the piece of substrate and one or more surfaces of the piece of casing.

13. The method of claim 12, wherein said attaching the array of covers over the two or more semiconductor die includes applying a thermal interface material between the array of covers and the corresponding semiconductor die.

14. The method of claim 12, wherein said singulating comprises sawing between adjacent covers in the array of covers through the casing.

15. The method of claim 12, wherein said forming is performed before said attaching the array of covers over the two or more semiconductor die.

16. The method of claim 12, wherein said forming is performed after said attaching the array of covers over the two or more semiconductor die.

17. A method to form a semiconductor package, the method comprising:

attaching an array of covers on a substrate strip having two or more semiconductor die, wherein a cover of the array of covers is over a semiconductor die of the substrate strip, and wherein the array of covers includes a casing around a periphery of two or more of the covers;

forming an encapsulant between the two or more semiconductor die; and singulating the substrate strip into two or more semiconductor packages, wherein a semiconductor package comprises a piece of substrate, a piece of encapsulant, a piece of casing, and one semiconductor die;

wherein a cover of one of the semiconductor packages is over the one semiconductor die of the semiconductor package and a substantial portion of the piece of substrate, and wherein one or more surfaces of the piece of encapsulant are coplanar with one or more surfaces of the piece of substrate and one or more surfaces of the piece of casing.

18. The method of claim 17, wherein said singulating comprises sawing between adjacent covers in the array of covers through the casing.

19. The method of claim 17, further comprising forming the array of covers by pouring a casing material into regions between the two or more covers and curing the casing material to form the casing into the block array.

20. The method of clam 17, further comprising forming the array of covers by disposing a resin sheet on the two or more covers and applying pressure to and curing the resin sheet into regions between the two or more covers to from the casing.

* * * * *